(12) United States Patent
Carmelo et al.

(10) Patent No.: US 10,043,676 B2
(45) Date of Patent: Aug. 7, 2018

(54) LOCAL SEMICONDUCTOR WAFER THINNING

(71) Applicant: Vishay General Semiconductor LLC, Hauppauge, NY (US)

(72) Inventors: Sanfilippo Carmelo, Turin (IT); Luigi Merlin, Turin (IT); Isabella Para, Sanfront (IT); Giovanni Richieri, Druento (IT)

(73) Assignee: VISHAY GENERAL SEMICONDUCTOR LLC, Hauppauge, NY (US)

( * ) Notice: Subject to any disclaimer, the term of this patent is extended or adjusted under 35 U.S.C. 154(b) by 0 days.

(21) Appl. No.: 14/884,090

(22) Filed: Oct. 15, 2015

(65) Prior Publication Data

US 2017/0110329 A1    Apr. 20, 2017

(51) Int. Cl.
| | |
|---|---|
| H01L 23/367 | (2006.01) |
| H01L 21/308 | (2006.01) |
| H01L 23/373 | (2006.01) |
| H01L 23/00 | (2006.01) |
| H01L 29/06 | (2006.01) |
| H01L 23/48 | (2006.01) |

(52) U.S. Cl.
CPC ........ *H01L 21/3083* (2013.01); *H01L 23/367* (2013.01); *H01L 23/3736* (2013.01); *H01L 23/481* (2013.01); *H01L 24/03* (2013.01); *H01L 24/05* (2013.01); *H01L 29/0657* (2013.01); *H01L 2224/0345* (2013.01); *H01L 2224/03452* (2013.01); *H01L 2224/03462* (2013.01); *H01L 2224/06181* (2013.01); *H01L 2924/10158* (2013.01); *H01L 2924/1306* (2013.01); *H01L 2924/13055* (2013.01); *H01L 2924/13091* (2013.01)

(58) Field of Classification Search
CPC .................................................. H01L 21/3083
See application file for complete search history.

(56) References Cited

U.S. PATENT DOCUMENTS

| | | | | |
|---|---|---|---|---|
| 6,528,351 | B1 * | 3/2003 | Nathan ............... | H01L 23/5389 257/E23.178 |
| 6,974,721 | B2 | 12/2005 | Koizumi | |
| 7,767,554 | B2 * | 8/2010 | Arita ................... | H01L 21/3043 257/E21.238 |
| 8,703,581 | B2 * | 4/2014 | Lei ......................... | H01L 21/78 438/462 |
| 8,912,078 | B1 * | 12/2014 | Lei ......................... | H01L 21/78 257/E21.001 |
| 2004/0080045 | A1 * | 4/2004 | Kimura ............. | H01L 21/76898 257/736 |
| 2004/0259329 | A1 * | 12/2004 | Boyle .................. | B23K 26/123 438/460 |

(Continued)

FOREIGN PATENT DOCUMENTS

| | | |
|---|---|---|
| JP | 2004-119718 A | 4/2004 |
| TW | 201407728 | 2/2014 |

*Primary Examiner* — Eugene Lee
(74) *Attorney, Agent, or Firm* — Stuart H. Mayer; Mayer & Williams PC

(57) ABSTRACT

A local thinning process is employed on the backside of a semiconductor substrate such as a wafer in order to improve the thermal performance of the electronic device built on or in the front side of the wafer.

21 Claims, 8 Drawing Sheets

(56) References Cited

U.S. PATENT DOCUMENTS

| | | | |
|---|---|---|---|
| 2006/0205182 A1* | 9/2006 | Soejima | H01L 21/78 |
| | | | 438/460 |
| 2007/0259463 A1 | 11/2007 | Abedini | |
| 2008/0280450 A1 | 11/2008 | Wang | |
| 2009/0008748 A1 | 1/2009 | Mancini | |
| 2010/0048001 A1* | 2/2010 | Harikai | H01J 37/32743 |
| | | | 438/464 |
| 2013/0062996 A1* | 3/2013 | Udayakumar | H01L 27/20 |
| | | | 310/321 |
| 2013/0256910 A1* | 10/2013 | Lee | H01L 21/76802 |
| | | | 257/774 |
| 2013/0285257 A1* | 10/2013 | Lee | H01L 24/03 |
| | | | 257/774 |
| 2014/0015118 A1 | 1/2014 | Bae | |
| 2015/0008556 A1 | 1/2015 | Liu et al. | |
| 2015/0294997 A1* | 10/2015 | Kim | H01L 27/1463 |
| | | | 257/432 |

* cited by examiner

LOCAL SEMICONDUCTOR WAFER THINNING

BACKGROUND

The operation of a semiconductor device is sensitive to its junction temperature. When the junction temperature exceeds its functional limit, semiconductor performance, life, and reliability can be significantly reduced.

In order to increase the operating temperature of a semiconductor device, its components can be configured to increase thermal dissipation. In this way, the device can better dissipate heat so that it can operate at high temperature or so that the area of the final device can be reduced while maintaining the same operating temperature. Since the active region of a semiconductor device is generally confined to its surface and a portion of the starting semiconductor bulk material (e.g. device bulk drift region which is normally thinner than the starting material thickness), there is a large amount of unused material (e.g., on the device's backside) which inhibits heat dissipation. This excess semiconductor bulk material can be removed with semiconductor thinning processes that require dedicated technologies.

In one exemplary manufacturing process, the front side of a semiconductor wafer undergoes semiconductor fabrication processing such that the electronic devices are formed in the front side of the wafer. One or more metallization layers are generally formed on the front side of the wafer to serve as front side electrodes. In the case where the electronic device is a power field effect transistor or an insulated gate bipolar transistor (IGBT), for instance, the control electrode is on the front side of the wafer. In the case of a power diode, the anode is on the front side of the wafer.

After device formation has been performed, including all the diffusion processing steps involved in the formation of the devices, wafer thinning may be performed. Either of two different wafer thinning processes are generally employed.

In a first wafer thinning process, the wafer is flipped over and a central portion of the backside of the wafer is thinned in what is often referred to as the Taiko grinding process. The outer peripheral rim portion of the backside of the wafer is, however, not thinned. As a result, a thicker peripheral edge support portion of the wafer is left surrounding a thinner central portion of the wafer. The thicker peripheral edge support portion provides mechanical stiffening such that the thinner central portion can be handled without cracking of the wafer. The thicker peripheral edge support portion also reduces wafer warpage in later processing steps.

After backside grinding, a backside metallization layer is formed on the thinner central portion of the backside of the wafer. The metallization layer forms an electrode on the backside of the power device. The peripheral edge support portion of the wafer may then be cut off, and the thinner central portion of the wafer may be diced to form individual device dice.

In a second wafer thinning process, sometimes referred to as the temporary bonding process, a semiconductor wafer with a plurality of electronic devices formed on the wafer's front side is bonded to a second wafer (a carrier wafer) by means of an adhesive layer.

The semiconductor wafer is thinned from the wafer backside until a desired target thickness is reached. Based on the semiconductor device type the backside is processed to complete the device structure using, e.g., implantation, thermal processes, metallization, etc. After the device is completed, the carrier wafer is de-bonded from the now thinned semiconductor wafer.

Ongoing improvements in semiconductor device performance are achieved by reducing the device dimensions (device rescaling), which requires further reductions in the semiconductor device thickness in order to optimize the device thermal dissipation.

SUMMARY

In accordance with one aspect of the subject matter disclosed herein, a local thinning process is employed on the backside of a semiconductor substrate such as a wafer in order to improve the thermal performance of the electronic device built on or in the front side of the wafer.

In one particular implementation, local wafer thinning is accomplished by applying a mask to the backside of the semiconductor wafer. The mask is patterned with a selected geometrical pattern and the backside of the semiconductor wafer is etched to transfer the selected geometrical pattern from the mask to the backside of the semiconductor wafer. The patterned backside structure is filled by a suitable metal, e.g. copper or any conductive material, using a suitable related deposition process, e.g. electroplating, CVD, PVD, etc. in order to guarantee good thermal conductivity. The geometrical pattern may be chosen to optimize the trade-off between the final thermal performance of the device and the mechanical behavior of the wafer (in terms of robustness and warpage).

DETAILED DESCRIPTION

The aforementioned conventional semiconductor wafer thinning processes are carried out on the whole semiconductor surface. Moreover, these processes employ dedicated equipment to manage the wafers to avoid any mechanical breakage or deformation, which could lead to yield issues and/or a degradation of the device's electrical performance.

The subject matter described herein addresses these and other problems. For instance, in one aspect the disclosed technique allows the device blocking capability and avalanche roughness of the outer device region (termination region) to be improved by optimizing both the active area thickness (thin region) and the termination region (thick region). In addition, the disclosed technique allows further improvements in the thermal and electrical properties of the final device by filling the trench structures defined during the local thinning process with a high conductivity material (e.g., copper).

As used herein, the terms "wafer" and "substrate" each refer to a free-standing, self-supporting structure and is not to be construed as a thin film layer that is formed on a free-standing, self-supporting structure.

FIGS. 1A-1E show a sequence of cross-sectional views of a semiconductor device illustrating a local wafer thinning process. The sequence begins in FIG. 1A, which shows a base material such as a semiconductor wafer 1 (e.g., a silicon wafer). The semiconductor wafer 1 has a front side 2 (also referred to as an upper side) and a backside 3 (also referred to as a lower side). One or more electronic devices 4 are fabricated in or on the front side 2 of semiconductor wafer 1. Illustrative examples of such electronic devices include, without limitation, IGBTs, MOSFETs, diodes or any other active device structures.

Figure 1A:
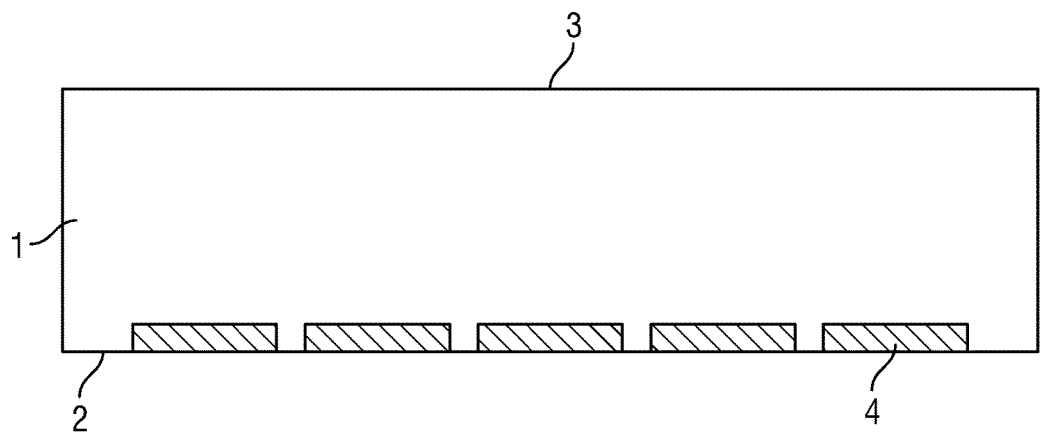
FIGS. 1A-1E schematically show one example of a process for locally thinning the backside of a semiconductor wafer.
Figure 1B:
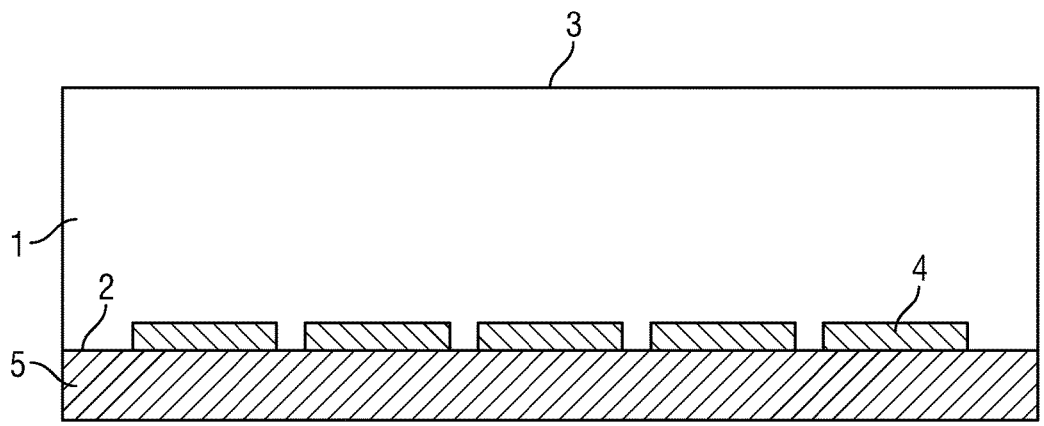
Figure 1C:
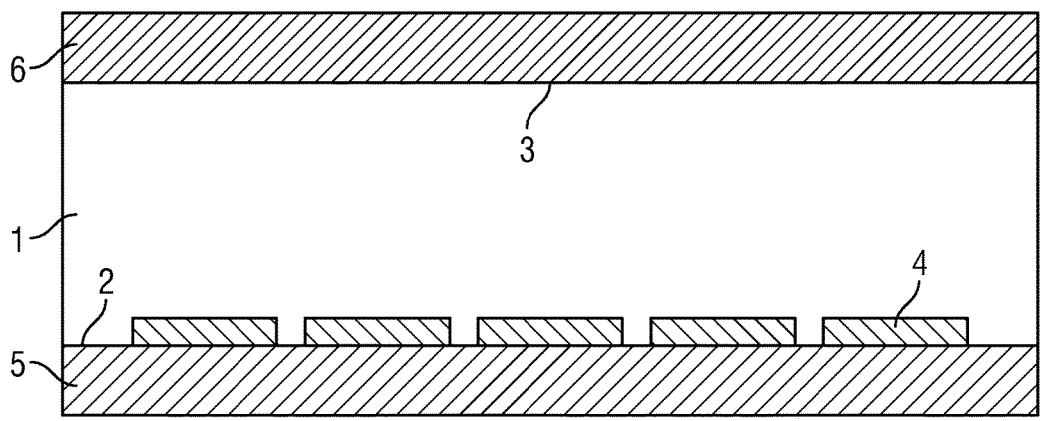

As shown in FIG. 1B, an optional protective layer 5 (a tape layer for example) is deposited on the front side 2 of the semiconductor wafer 1 to protect the electronic devices 4 during the subsequent processes performed on the backside 3. Likewise, as shown in FIG. 1C, another optional protective layer 6 (or a stack of suitable material layers) is deposited on the semiconductor wafer 1 backside 3 to protect the surface during the subsequent process steps.

Figure 1D:
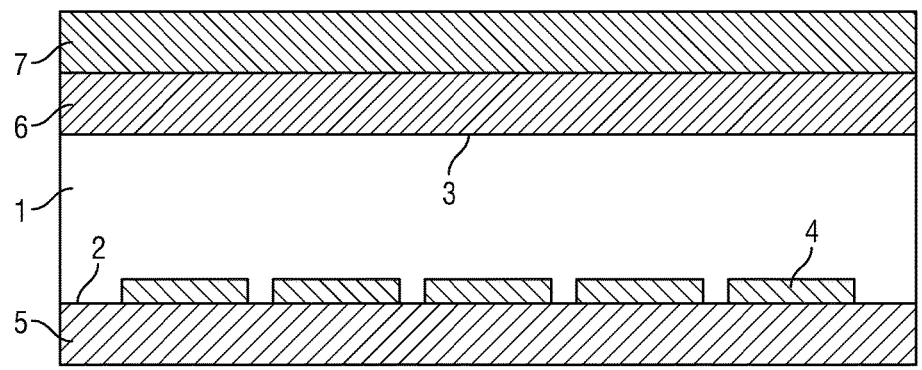

Next, in FIG. 1D, a second layer 7 (e.g., a polymer layer) is deposited on the protective layer 6. The second layer 7 acts as hard mask for the successive process steps. The second layer 7 is patterned with a desired geometrical pattern using a suitable process technology such as photolithography, for instance. The geometrical pattern defines the local thinning pattern that is to be transferred to the backside 3 of the semiconductor wafer 1 by removal of selected portions of the wafer 1. Illustrative geometrical patterns are shown in FIGS. 4A-4H, where the dark (or light) regions represent the regions on the backside 3 of the wafer 1 that are locally thinned. In general, the geometric pattern may comprise a plurality of depressions such as grooves, trenches, holes etc., or any combination thereof.

Figure 1E:
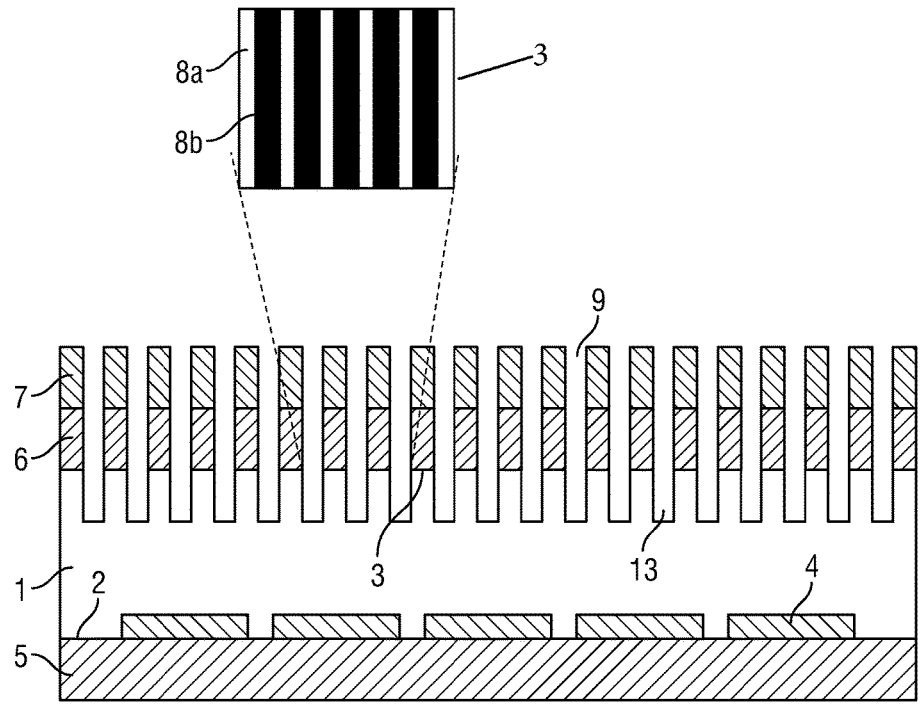

Referring now to FIG. 1E, an etch process is performed to transfer the pattern from the second layer 7 to the semiconductor wafer 1. As indicated in FIG. 1E, the pattern 9 that is transferred in this example forms depressions 13 in the backside 3 of the wafer 1 and corresponds to the pattern of grooves shown in FIG. 4E. Subsequent processing steps involve the removal of first and second layers 6 and 7 from the now locally thinned backside 3 of the wafer 1, followed by any other processing steps needed to define the backside of the electronic device 4, including, for example, deposition, photolithography, thermal, mechanical and doping processes.

Figure 2A:
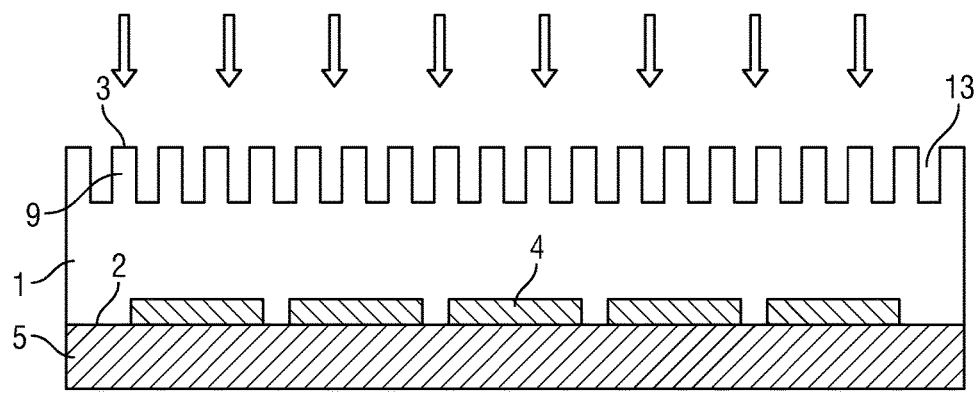
FIGS. 2A-2C schematically show one example of a process after semiconductor wafer local thinning has been performed.
Figure 2B:
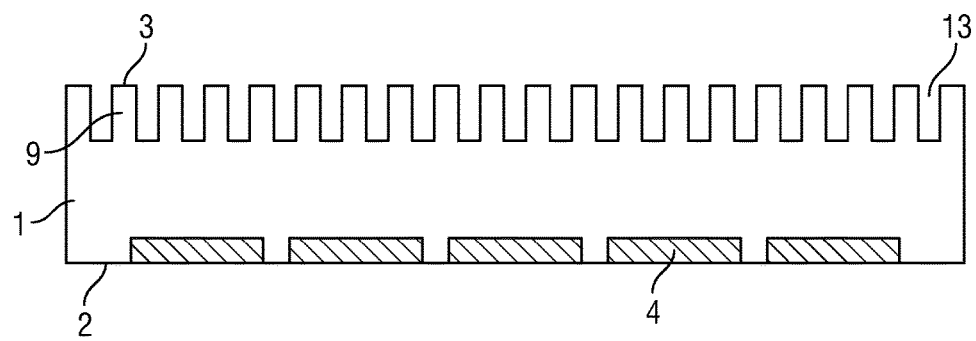
Figure 2C:
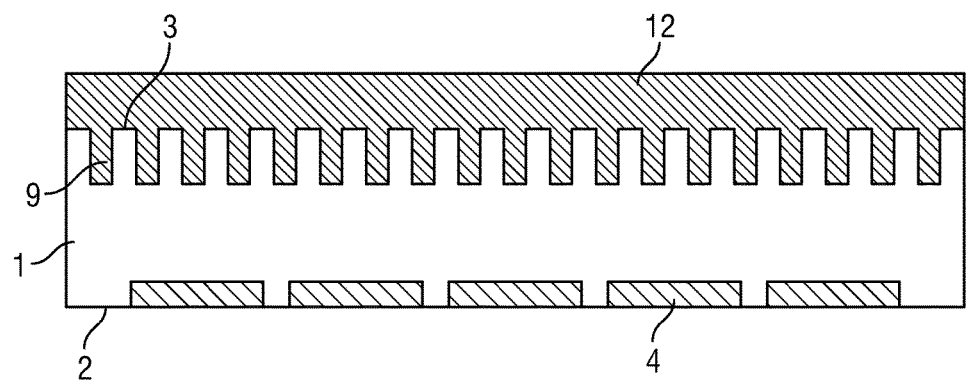
Figure 6:
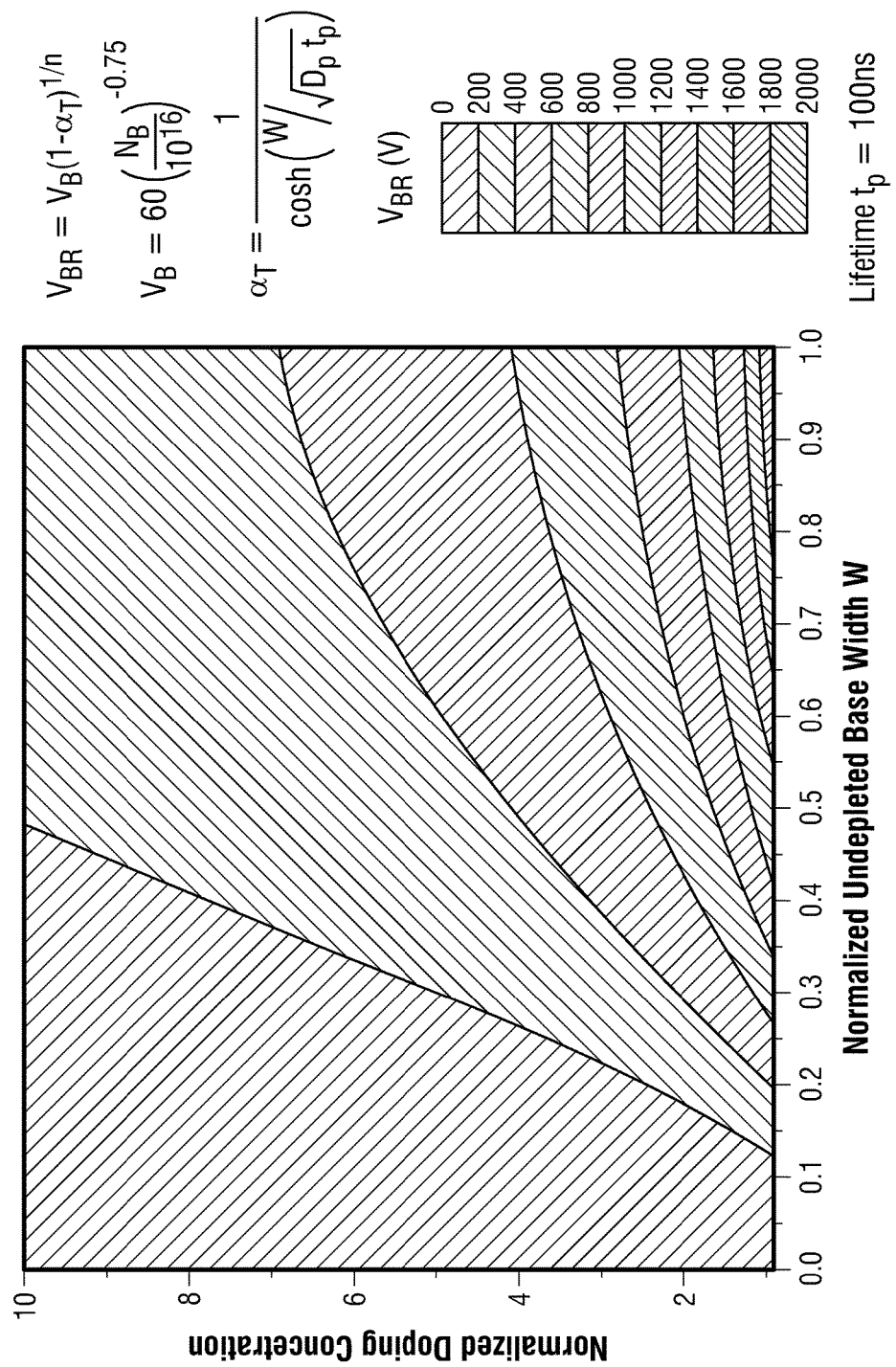
FIG. 6 shows the silicon breakdown voltage as function of the un-depleted base width and doping concentration for a bipolar transistor obtained from a theoretical calculation.

For instance, FIGS. 2A-2C show a sequence of cross-sectional views of a semiconductor device after local thinning has been performed. In FIGS. 1 and 6 as well as the FIGs. that follow, like elements will be denoted by like reference numerals. As indicated in FIG. 2A, one or more doping deposition processes (from, e.g., a solid or liquid source or by ion implantation) can be performed for defining the collector region of an insulated-gate bipolar transistor (IGBT) (including the formation of a buffer region), or for defining the emitter region of a device. A thermal process may be subsequently performed to activate the doping species in the backside 3 of the device. Then, as shown FIG. 2B, the protective layer 5 is removed and, as shown in FIG. 2C, a metal layer 12 (or a stack of layers) is deposited on the backside 3 of the wafer 1 to define the electrical and thermal contact. It should be noted that in this example the metal layer 12 fills the depressions 13 in the wafer backside 3 that have been formed by etching during the local thinning process.

The local wafer thinning process described above allows semiconductor material to be selectively removed from the backside of the wafer in accordance with a specified geometric pattern, consequently reducing the thermal resistance of the final semiconductor device. Moreover, structuring the device backside in this manner enables the overall device performance to be better tailored. In addition, the local wafer thinning process allows warpage to be minimized, semiconductor wafer strength to be improved and the overall mechanical roughness of the backside surface to be optimized for performing the process steps subsequent to the thinning process.

Illustrative detailed examples of some of the aforementioned processing steps will next be presented. It should be noted that these examples are presented for purposes of illustration only and are not to be construed as limitations on the subject matter disclosed herein.

In one embodiment, a protective layer 5 (see FIG. 1), for instance a suitable tape material, is deposited on the front side 2 of the wafer 1 to protect the electronic devices 4 built in or on the wafer 1 during the successive process steps. A thin non-conductive layer 6 (e.g. silicon oxide or any suitable insulating material) (see FIG. 1) is deposited on the backside 3 of the wafer 1 by Physical Vapor Deposition, or any other suitable deposition process. The non-conductive layer 6 protects the semiconductor regions that are not to be involved during, e.g., the subsequent metal (e.g. copper) deposition process.

The second layer 7 that serves as a hard mask may be a photoresist or any polymer material suitable for a photolithography process, which is deposited on the non-conductive layer 6 in order to transfer the desired geometry pattern on the wafer backside. The photolithography process is performed to transfer the geometry pattern onto the backside 3 of the wafer 1. The photoresist layer acts as a hard mask that protects the semiconductor regions that are not to be etched. The inset of FIG. 1E shows a plan view of the backside 3 of the wafer having patterns 8A and 8B, where pattern 8A corresponds to regions of the backside 3 that are not to undergo etching and pattern 8B corresponds to regions of the backside 3 that are to undergo etching.

The photolithography process includes a Deep Reactive-Ion Etching (DRIE) step that is performed to transfer the geometry patterns 8A and 8B onto the backside 3 of the semiconductor wafer 1. Deep Reactive Ion Etching is an anisotropic dry etch process that uses plasma to deeply etch a semiconductor material (silicon as example) with a high aspect ratio. The result of this etching are trenches in the wafer 1. It should be noted that a DRIE process is presented by way of illustration only, and more generally, any other suitable semiconductor etching process may be employed for this purpose.

The plasma is generated in a vacuum chamber and the ions are accelerated in a nearly vertical direction. The first etching step involves a plasma consisting of Carbon Tetrafluoride ($CF_4$) and an Oxygen mixture in order to remove the silicon oxide layer regions not protected by the photoresist (in accordance with the chosen geometry patterns 8A and 8B). Any other suitable insulating layer etching process method can be considered for this purpose.

A second etching step used for etching is the Bosch process but any other suitable semiconductor etching process method can be considered for this purpose. This method alternates repeatedly between two phases: a standard silicon removal phase using a Sulfur Hexafluoride ($SF_6$) plasma, which attacks the directly exposed silicon regions, and a second phase in which a chemically inert passivation layer of Octafluorocyclobutane ($C_4F_8$) is deposited, which condenses on the material sidewalls and protects them from lateral etching. The number of these etch and deposition sequences is selected in accordance with the final selected value for the silicon local thickness (e.g. the amount of material to be removed in order to reach the target local thickness). The $C_4F_8$ passivation layer deposition protects the entire wafer from further chemical attack and prevents further etching. However, during the etching phase, the directional ions that bombard the substrate attack the $C_4F_8$ passivation layer at the bottom of the trench (but not along the sides). Ions collide with the material substrate and sputter it off, exposing the substrate to the chemical etchant. These etch and deposition sequences generally last a few seconds and are repeated multiple times, resulting in a large number of very small isotropic etch steps taking place only at the bottom of the etched pits.

Using a combination of these two phases deep trenches with highly vertical sidewalls can be formed (e.g., with high aspect ratio). Based on the etch rate, it is possible to establish the number of steps needed in order to obtain the desired semiconductor thickness reduction (e.g., the final depth of the target trench). During the process, the plasma also etches the hard mask 7 (see FIG. 1), but the photoresist has an etch rate that is less than the silicon one. The photoresist that remains after DRIE is important for the next process and is a process parameter to be optimized. Such a subsequent deposition process may include the single or multiple doping deposition process referred to in FIG. 2 for defining the collector region or the emitter region of a device, for instance, followed by application of a thermal process to activate the doping species in the backside 3 of the wafer 1.

In some embodiments, a seed layer may be deposited on the entire etched backside 3 of the wafer 1. The seed layer is used in conjunction with a subsequent suitable metal deposition process such as copper electroplating, which defines the final ohmic contact on the backside 3 of the wafer 1. The seed layer may include a sequence of different thin films formed from materials such as Titanium, Nickel, Gold and Copper or any other suitable material sequence, deposited by any suitable deposition process (e.g. electroplating, CVD, PVD . . . ), in order to have a good adhesion on the wafer and to prevent diffusion into the bulk material. The sequence of material layers in the seed layer can be chosen to ensure reliable adhesion and a low resistance contact (ohmic contact) of the semiconductor (e.g., silicon) with the final metal backside contact. Moreover, the sequence of material layers should be chosen to prevent e.g. copper diffusion into the semiconductor material, which could compromise the electronic device electrical performance.

The seed layer can be removed from the sidewall tops by a photoresist lift-off process. Finally, the bottom of the trenches may be completely covered by the seed layer and the sidewall tops may be covered by the silicon oxide layer to avoid copper growth. As shown in FIG. 2C a conductive layer 12 (e.g. copper or any suitable metal), is deposited by means of suitable related deposition process (e.g. electroplating, CVD, PVD . . . ) on the backside 3 of the wafer 1 to define the cathode contact of the electronic device present on the front side 2 of the wafer 1.

The electroplating process may be carried out using an electric current to reduce any dissolved metal cations in order to form a coherent metal coating. First, the semiconductor wafer is placed in the cathode of the circuit. The anode is made of copper that is to be deposited on the cathode semiconductor substrate; both components are immersed in an electrolyte solution composed of copper sulfate that permits the flow of electricity. A power generator supplies a direct current to the anode, oxidizing the copper atoms to $Cu^{2+}$ by losing two electrons, which associates with the anion present in the solution. At the cathode, the dissolved copper ions $Cu^{2+}$ in the electrolyte solution are reduced at the interface between the solution and the cathode to metallic copper by gaining two electrons. The rate at which the anode is dissolved is equal to the rate at which the cathode is plated. In this manner, the ions in the electrolyte bath are continuously replenished by the anode. The result is the effective transfer of copper from the anode source to a plate covering the cathode. The electroplating process allows the depressions 13 (e.g., trenches) to be filled with copper, which defines the cathode 12 ohmic contact on the backside 3 of the wafer 1. In some embodiments, instead of an electroplating process, any other suitable metal deposition process method may be used, such as a chemical vapor deposition process (CVD) or a physical vapor deposition (PVD) process, for example.

Figure 3:
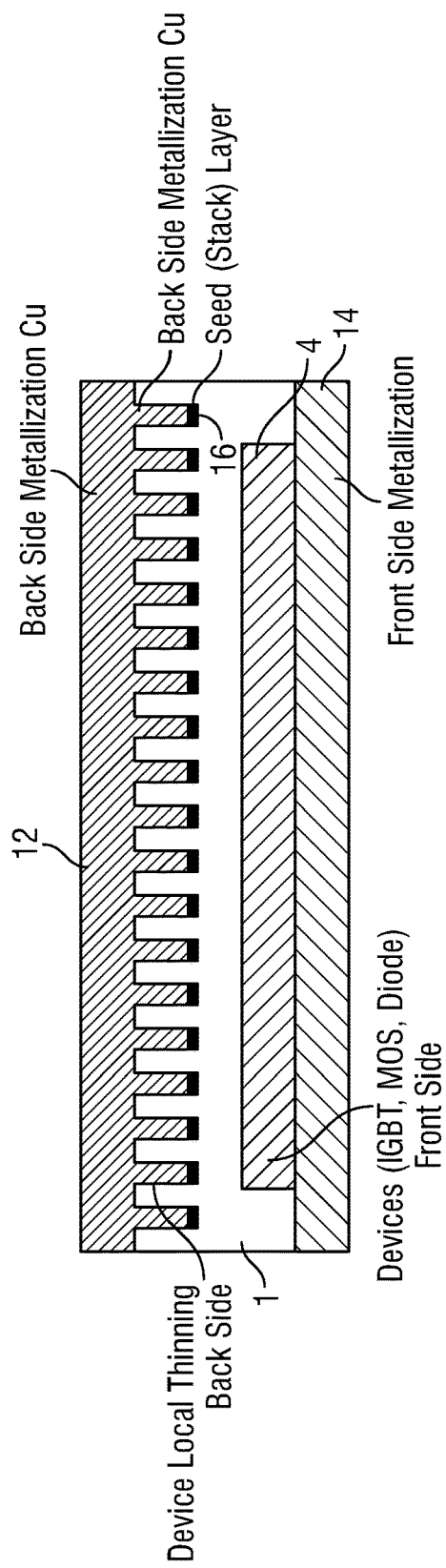
FIG. 3 schematically shows the final structure of one example of a locally thinned semiconductor device with a metallization stack formed on the thinned backside of the wafer.
Figure 4A:
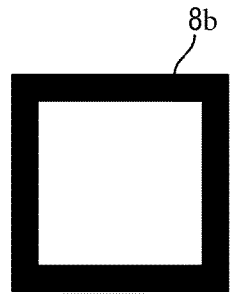
FIG. 4A-4H show illustrative geometrical patterns that may be applied to the backside of the wafer during the wafer thinning process.
Figure 4B:
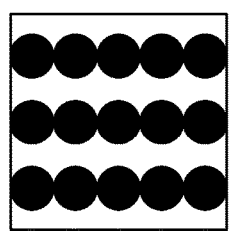
Figure 4C:
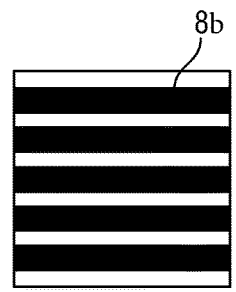
Figure 4D:
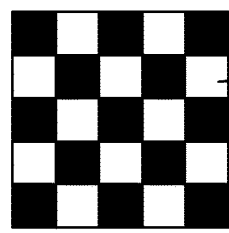
Figure 4E:
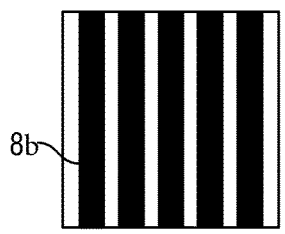
Figure 4F:
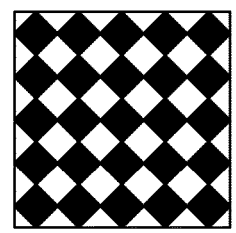
Figure 4G:
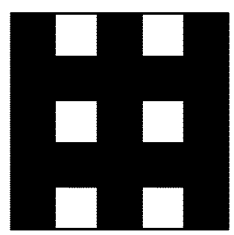
Figure 4H:
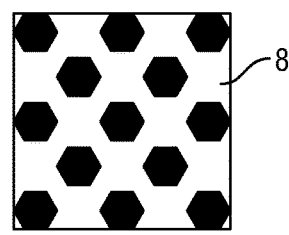

A soft back grinder process, or any suitable process, may be performed on the backside 3 of the wafer 1 in order to remove the metal excess from the holes and top walls and the insulating layer 6. The soft back grinder process causes the wafer surface to become planar and regular. An additional metal stack may be deposited on the metal layer to complete the cathode structure 12. The resulting final structure, shown in FIG. 3, illustrates the backside metallization layer 12, seed layer 16 underlying the metallization layer 12 in the depressions 13 and the front metallization layer 14.

Figure 5A:
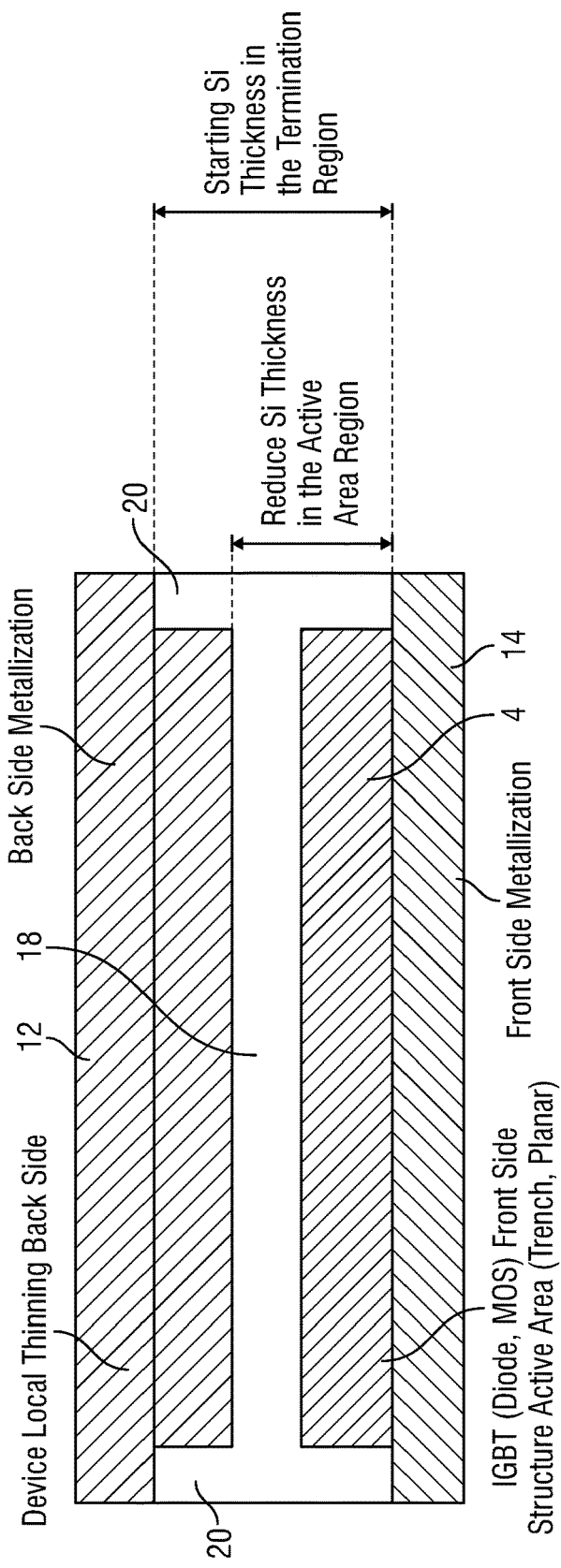
FIGS. 5A and 5B show a top and cross-sectional view, respectively, of IGBT or other device having a different semiconductor thickness in the active area and in the termination region.
Figure 5B:
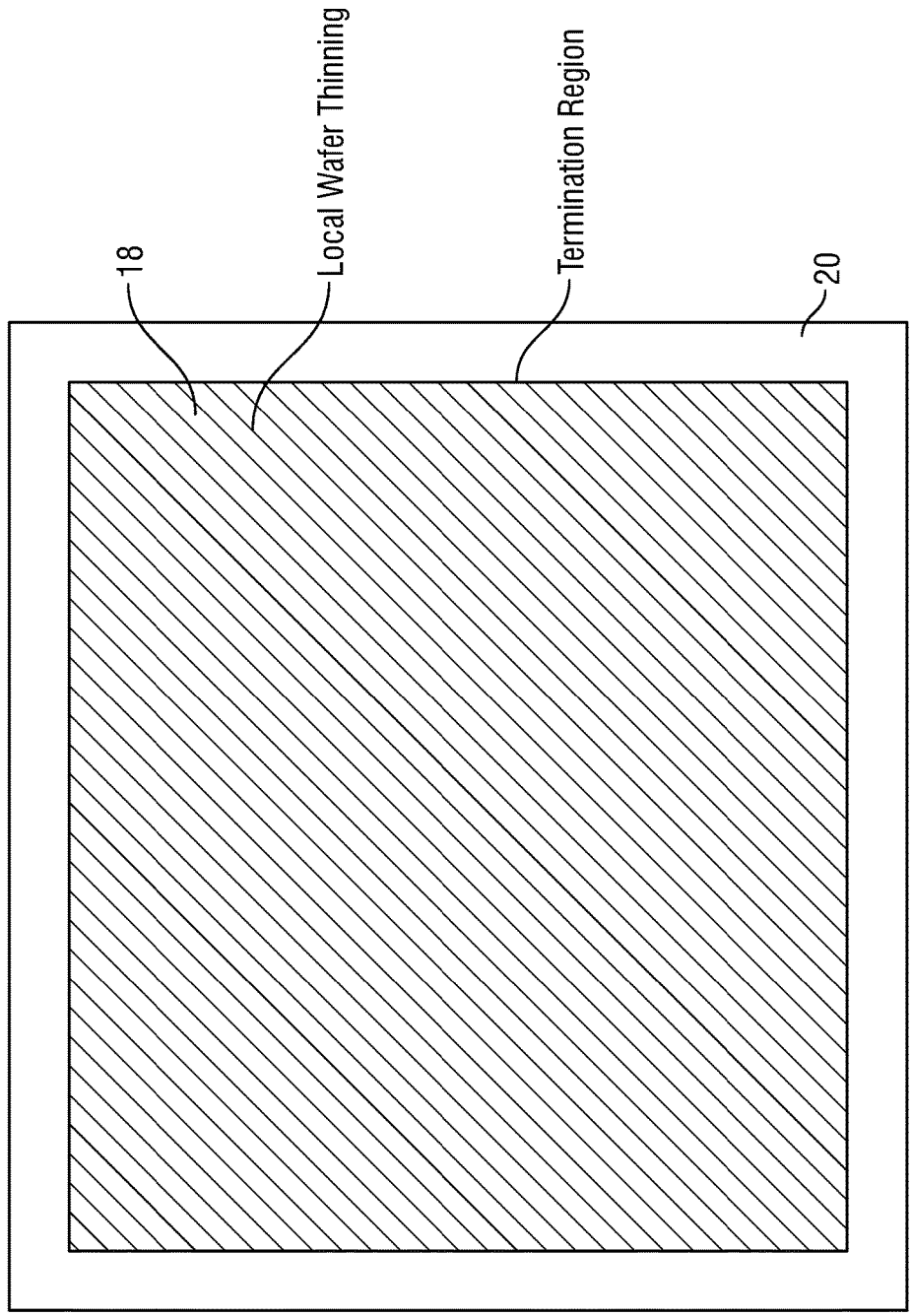

FIGS. 5A and 5B show a top view and a cross-sectional view, respectively, of another embodiment in which the local thinning process is applied to an IGBT device (e.g., any device with an IGBT structure located on or in the frontside 2 of the wafer 1). In this case the wafer is only thinned in the active area 18 of the device in which the IGBT (such as a planar or trench IGBT, for example) is located, leaving the wafer thickness in the termination region 20 equal to its starting value or to a different thickness less than its initial value, but greater than the active area thickness. The device structure is completed by defining the collector and buffer regions (by using, for instance, a suitable doping process to define n and p type regions, and a thermal process to activate the deposited doping species) and depositing the backside contact metal 12. Because of the different wafer thicknesses in the active area 18 and the termination region 20, the final structure is characterized by a long-base transistor in the termination region and a short-base transistor in the active area region.

Therefore, in the active area 18 the thickness and bipolar efficiency of the IGBT can be optimized by tailoring the trade-off between SOA, switching and conduction losses as in conventional thinning technology. Moreover, the local thinning process allows the device termination to be designed with a low bipolar efficiency, due to the log-base transistor, suppressing the reduction in the blocking capability due to the bipolar effect. Hence, the local thinning process allows a significant increase in the termination avalanche roughness and blocking capability as compared to the conventional thinning process, where the wafer in the active area and termination regions have the same final material thickness.

As is well-know, the blocking capability of a semiconductor bipolar structure strongly depends on the silicon doping concentration, minority carrier lifetime and the undepleted base region width. The results of a simple calculation are shown in FIG. 6, which demonstrates that the semiconductor (silicon as example) blocking capability increases with the material thickness, e.g. with the undepleted base region width. Increasing the base region thickness in the termination region allows the termination blocking capability and avalanche roughness to be significantly improved. The combined use of the local thinning process with the adoption of a thick copper collector metal contact is beneficial for the short circuit capability of the IGBT, because of the copper's capability to extract heat generated in the IGBT semiconductor volume when short circuited.

In another embodiment the local thinning approach is applied to a diode as well as to a MOSFET (having any suitable MOS structure). The local thinning approach allows the termination thickness to be modulated relative to the active area thickness, leading to the optimization of the termination blocking capability and avalanche roughness without any impact on the performance of the active area of the device.

Moreover, the techniques described herein are not limited to the particular electronic devices illustrated herein, but more generally may be applied to a wide variety of different electronic devices in order to improve their electrical and thermal performance.

Although the subject matter has been described in language specific to structural features and/or methodological acts, it is to be understood that the subject matter defined in the appended claims is not necessarily limited to the specific features or acts described above. Rather, the specific features and acts described are disclosed as example forms of implementing the claims.

The invention claimed is:

1. A method for thinning a semiconductor substrate, comprising:
   providing a semiconductor substrate having a front side on or in which at least one electronic device is disposed, wherein the semiconductor substrate includes an active area and a termination region, the electronic device being formed on or in the active area;
   performing a photolithographic process to locally thin the semiconductor substrate, the photolithographic process including:
      (i) applying a photolithographic mask to a backside of the semiconductor substrate;
      (ii) patterning the photolithographic mask with a selected geometrical pattern; and
      (iii) etching the backside of the semiconductor substrate to transfer the selected geometrical pattern from the photolithographic mask to the backside of the semiconductor substrate, wherein the selected geometrical pattern transferred to the backside of the semiconductor substrate includes a plurality of depressions that do not fully extend though the semiconductor substrate such that the semiconductor substrate is not diced into multiple dice, wherein the etching etches the backside of the semiconductor substrate in the active area but not the termination region such that the backside is only thinned in the active area.

2. The method of claim 1 wherein the plurality of depressions include one or more grooves, trenches, holes or combinations thereof.

3. The method of claim 1 further comprising applying a protective layer to the front side of the semiconductor substrate before applying the mask.

4. The method of claim 1 further comprising applying a protective layer to the backside of the semiconductor substrate, wherein the applying the mask includes applying the mask onto the protective layer.

5. The method of claim 1 wherein the mask comprises a polymer material suitable for a photolithography process.

6. The method of claim 1 wherein etching the backside of the semiconductor substrate comprises etching the backside of the semiconductor substrate using a Deep Reactive-Ion Etching process.

7. The method of claim 1 wherein etching the backside of the semiconductor substrate comprises etching the backside of the semiconductor substrate using a Bosch process.

8. The method of claim 1 wherein the electronic device includes a diode.

9. The method of claim 1 wherein the electronic device includes a bipolar transistor.

10. The method of claim 1 wherein the electronic device includes a power field effect transistor.

11. The method of claim 1 wherein the electronic device includes a MOSFET.

12. The method of claim 1 further comprising performing one or more additional processes on the backside of the semiconductor substrate after etching the backside of the semiconductor substrate.

13. The method of claim 12 wherein the one or more additional processes are selected from the group consisting of deposition, photolithography, thermal, mechanical and doping processes.

14. The method of claim 12 wherein the one or more additional processes include a metal deposition process.

15. The method of claim 12 wherein etching the backside of the semiconductor wafer includes forming depressions in the backside of the semiconductor wafer and the one or more additional processes include a conductive material deposition process to fill depressions in the patterned backside structure.

16. The method of claim 15 further comprising depositing a seed layer on the backside of the semiconductor substrate before performing the conductive material deposition additional process.

17. The method of claim 1 wherein the electronic device is selected from the group consisting of an insulated-gate bipolar transistor (IGBT), Field Effect Transistor (FET), MOSFET and a diode.

18. A semiconductor substrate fabricated in accordance with the method set forth in claim 1.

19. The semiconductor substrate of claim 18 further comprising an electronic device disposed on a front side of the substrate.

20. The method of claim 15 wherein the conductive material is copper and the conductive material deposition process is an electroplating process.

21. The method of claim 15 wherein the one or more additional processes include a chemical vapor deposition process (CVD) or a physical vapor deposition (PVD) process for filling depressions in the patterned backside structure.

* * * * *